United States Patent
Lee et al.

(10) Patent No.: US 10,670,968 B2
(45) Date of Patent: Jun. 2, 2020

(54) MASKLESS EXPOSURE METHOD, MASKLESS EXPOSURE APPARATUS AND METHOD OF MANUFACTURING A SEMICONDUCTOR DEVICE USING THE SAME

(71) Applicant: SAMSUNG ELECTRONICS CO., LTD., Suwon-si, Gyeonggi-do (KR)

(72) Inventors: Sang-Min Lee, Yongin-si (KR); Sang-Hyun Park, Yongin-si (KR); Won-Don Joo, Incheon (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/109,054

(22) Filed: Aug. 22, 2018

(65) Prior Publication Data
US 2019/0146347 A1    May 16, 2019

(30) Foreign Application Priority Data
Nov. 14, 2017 (KR) .......... 10-2017-0151818

(51) Int. Cl.
G03F 7/20 (2006.01)
H01L 21/027 (2006.01)

(52) U.S. Cl.
CPC .......... *G03F 7/2059* (2013.01); *G03F 7/2051* (2013.01); *G03F 7/703* (2013.01); *G03F 7/70291* (2013.01); *H01L 21/0274* (2013.01)

(58) Field of Classification Search
CPC ........ G03F 7/2059; G03F 7/2051; G03F 7/70; H01L 21/0274
See application file for complete search history.

(56) References Cited

U.S. PATENT DOCUMENTS

| 7,251,020 | B2 | 7/2007 | Gui | |
| 2002/0159044 | A1* | 10/2002 | Mei | G03F 7/70275 355/67 |
| 2007/0013889 | A1 | 1/2007 | Jorritsma et al. | |
| 2012/0120488 | A1* | 5/2012 | Lee | G02B 3/0056 359/463 |
| 2017/0235028 | A1* | 8/2017 | Uchida | G02B 3/00 359/599 |

FOREIGN PATENT DOCUMENTS

| JP | 2007-041276 | 2/2007 |
| JP | 2008-091793 | 4/2008 |
| JP | 2009-080324 | 4/2009 |
| JP | 2013-179305 | 9/2013 |

* cited by examiner

*Primary Examiner* — Edward Chin
(74) *Attorney, Agent, or Firm* — F. Chau & Associates, LLC

(57) ABSTRACT

A maskless exposure method includes spatially modulating a light output from a light source into a pattern beam having a mask pattern, condensing the modulated pattern beam into a first group of spot beams having a first focal position on a Z-axis substantially perpendicular to an exposure surface of an object layer, and into a second group of spot beams having a second focal position different from the first focal position, and scanning the object layer with the first and second groups of spot beams. The object layer has a first height and a second height different from the first height.

20 Claims, 18 Drawing Sheets

MASKLESS EXPOSURE METHOD, MASKLESS EXPOSURE APPARATUS AND METHOD OF MANUFACTURING A SEMICONDUCTOR DEVICE USING THE SAME

CROSS-REFERENCE TO RELATED APPLICATIONS

This application claims priority under 35 U.S.C. § 119 to Korean Patent Application No. 10-2017-0151818, filed on Nov. 14, 2017, the disclosure of which is incorporated by reference herein in its entirety.

TECHNICAL FIELD

Exemplary embodiments of the present invention relate to a maskless exposure method, a maskless exposure apparatus, and a method of manufacturing a semiconductor device using the same. More particularly, exemplary embodiments relate to a maskless exposure method using a spatial light modulator, a maskless exposure apparatus, and a method of manufacturing a semiconductor device using the same.

DISCUSSION OF THE RELATED ART

An exposure apparatus may be used to form a pattern on a substrate such as, for example, a flat panel display (FPD) or a semiconductor wafer. As the size of the substrate increases and the pattern to be formed requires increased precision, manufacturing costs of a photomask increase. A maskless exposure apparatus may achieve reduced costs. Such a maskless exposure apparatus may use a bundle of spot beams directed onto an object layer of the substrate by an optical system having a spatial light modulator (SLM) to expose a pattern. Foci of all of the spot beams may be adjusted together by an autofocus function. However, when an object layer has a height difference within a scan exposure width in a single scan, since the foci of all of the spot beams are changed together using the autofocus function, all of the spot beams may not be focused precisely on portions having different heights due to the height difference.

SUMMARY

Exemplary embodiments of the present invention provide a maskless exposure method capable of preventing resolution degradation caused by defocus due to a height difference within a region smaller than a scan exposure width.

Exemplary embodiments of the present invention provide a method of manufacturing a semiconductor device using the above-described maskless exposure method.

Exemplary embodiments of the present invention provide a maskless exposure apparatus for performing the above-described method.

According to exemplary embodiments of the present invention, a maskless exposure method includes spatially modulating a light output from a light source into a pattern beam having a mask pattern, condensing the modulated pattern beam into a first group of spot beams having a first focal position on a Z-axis substantially perpendicular to an exposure surface of an object layer, and into a second group of spot beams having a second focal position different from the first focal position, and scanning the object layer with the first and second groups of spot beams. The object layer has a first height and a second height different from the first height.

According to exemplary embodiments of the present invention, a method of manufacturing a semiconductor device includes forming an object layer on a substrate. The object layer has a first height and a second height different from the first height. The method further includes detecting a height difference between the first height and the second height, generating exposure data based on the detected height difference, spatially modulating a light output from a light source into a pattern beam having a mask pattern, condensing the modulated pattern beam into a first group of spot beams having a first focal position on a Z-axis substantially perpendicular to an exposure surface of the object layer, and into a second group of spot beams having a second focal position different from the first focal position, and scanning a first portion of the object layer having the first height with the first group of spot beams according to the exposure data, and a second portion of the object layer having the second height with the second group of spot beams according to the exposure data.

According to exemplary embodiments of the present invention, a maskless exposure apparatus includes a stage that supports a substrate having an object layer to be exposed. The stage moves the substrate in at least one direction. The apparatus further includes a light source that outputs a light, a light modulator that spatially modulates the outputted light into a pattern beam having a mask pattern, and a multi-lens array including a first micro lens array group and a second micro lens array group. The first micro lens array group condenses the modulated pattern beam into a first group of spot beams having a first focal position on a Z-axis substantially perpendicular to an exposure surface of the object layer, and the second micro lens array group condenses the modulated pattern beam into a second group of spot beams having a second focal position different from the first focal position.

According to exemplary embodiments of the present invention, a pattern beam having a mask pattern is condensed into a first group of spot beams having a first focal position with respect to an exposure surface and a second group of spot beams having a second focal position different from the first focal position, respectively, and the first and second spot beams are scanned onto portions of an object layer having different heights, respectively.

Accordingly, when the object layer has a step difference in a region smaller than an exposure scan width of an optical head, the object layer may be exposed with the spot beams having different focal surfaces of different heights. Thus, resolution degradation due to defocus may be prevented or reduced to thereby improve resolution of the exposure apparatus.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
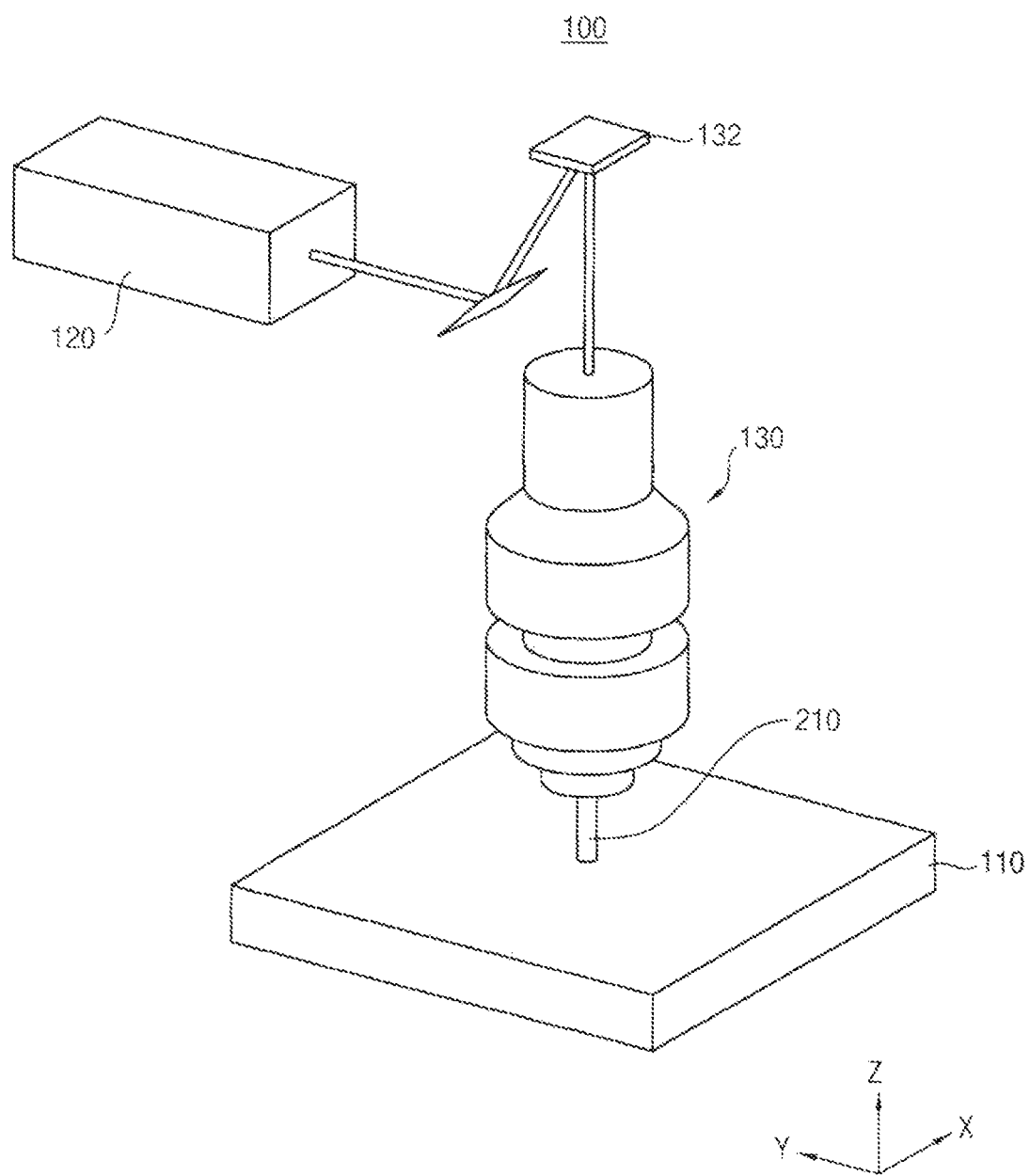
FIG. 1 is a perspective view illustrating a maskless exposure apparatus according to exemplary embodiments of the present invention.

Exemplary embodiments of the present invention will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

Figure 2:
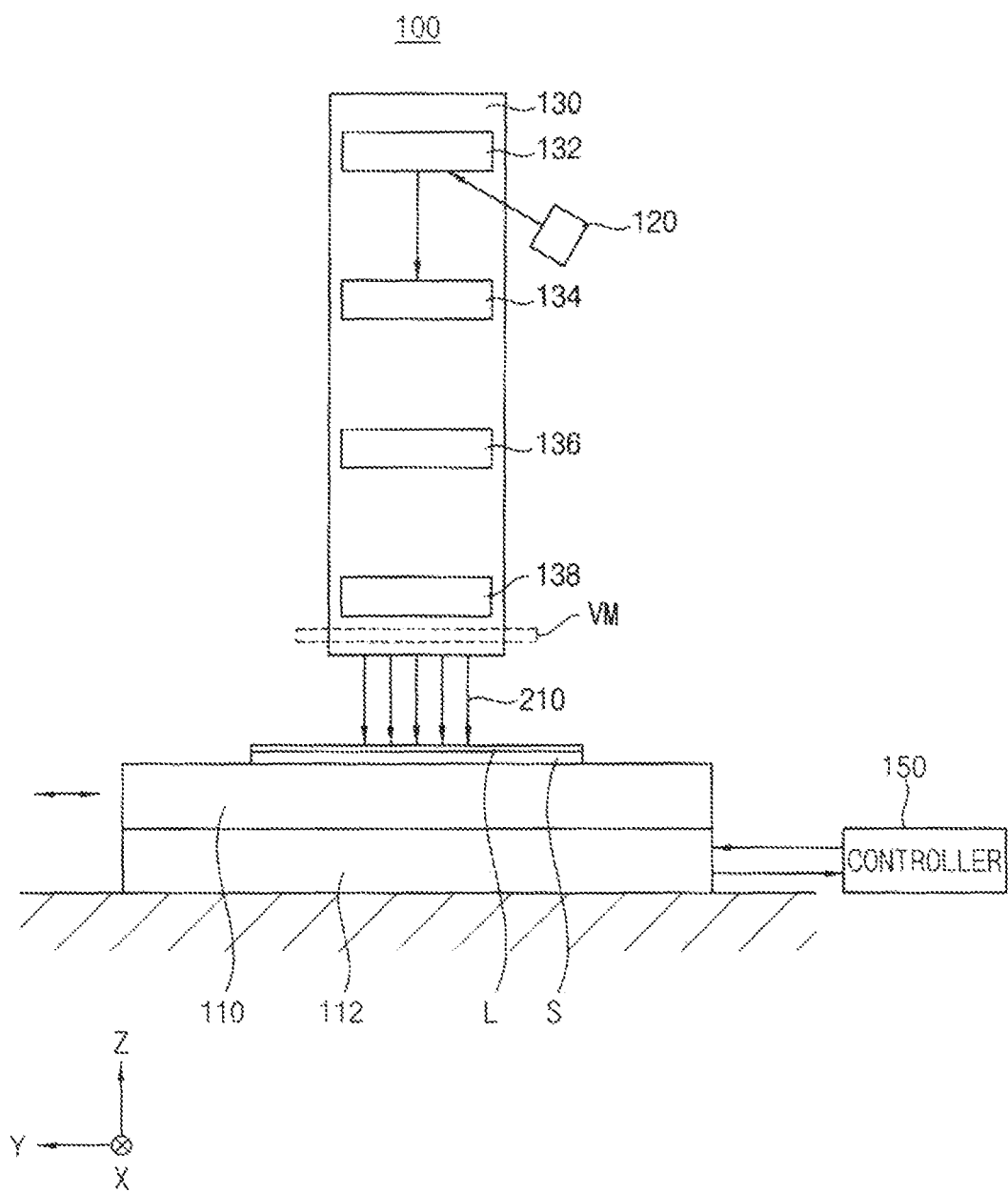
FIG. 2 is a block diagram illustrating the maskless exposure apparatus in FIG. 1 according to exemplary embodiments of the present invention.
Figure 3:
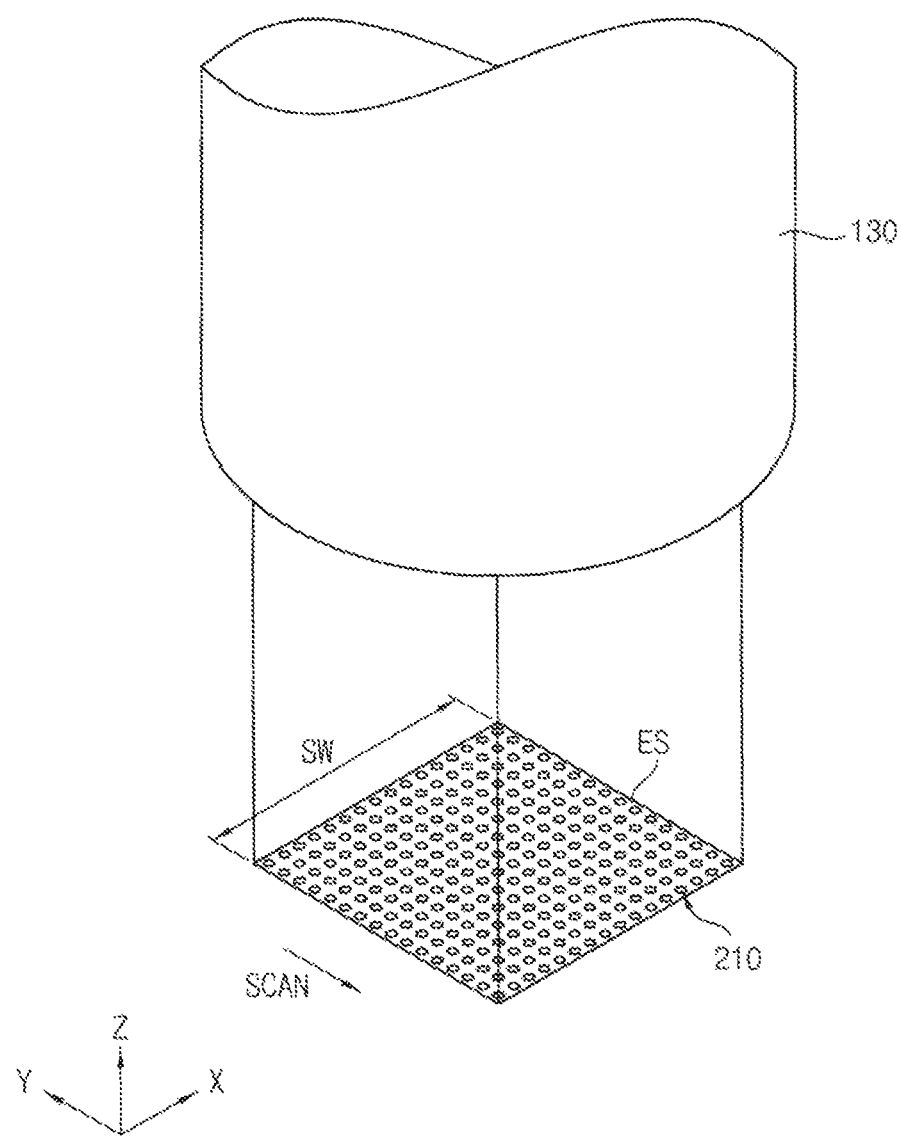
FIG. 3 is a perspective view illustrating a bundle of spot beams directed onto an exposure surface by an optical head of the maskless exposure apparatus in FIG. 1 according to exemplary embodiments of the present invention.
Figure 4:
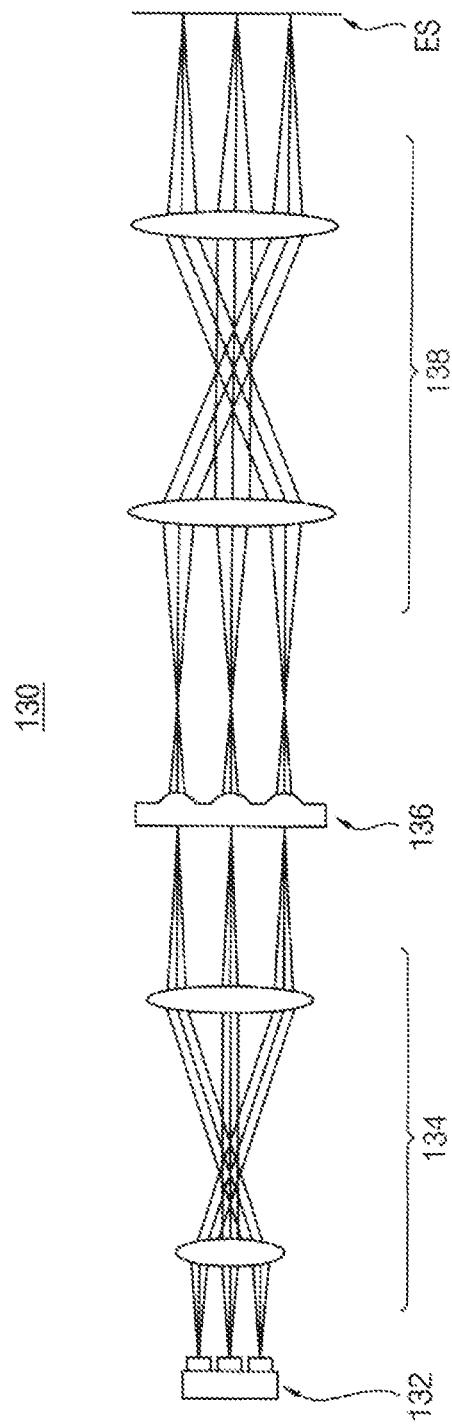
FIG. 4 is a cross-sectional view illustrating an optical system of the maskless exposure apparatus in FIG. 1 according to exemplary embodiments of the present invention.
Figure 5A:
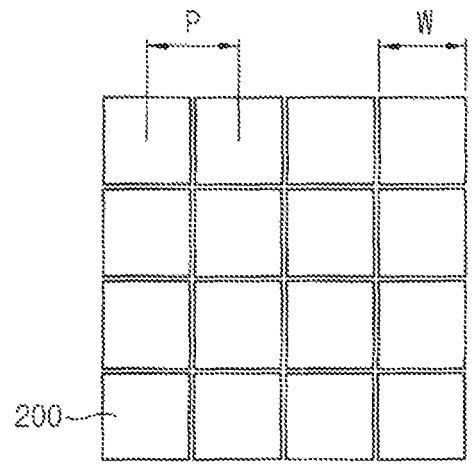
FIG. 5A is a view illustrating a micro mirror array of a light modulation element of the optical system in FIG. 4 according to exemplary embodiments of the present invention.
Figure 5B:
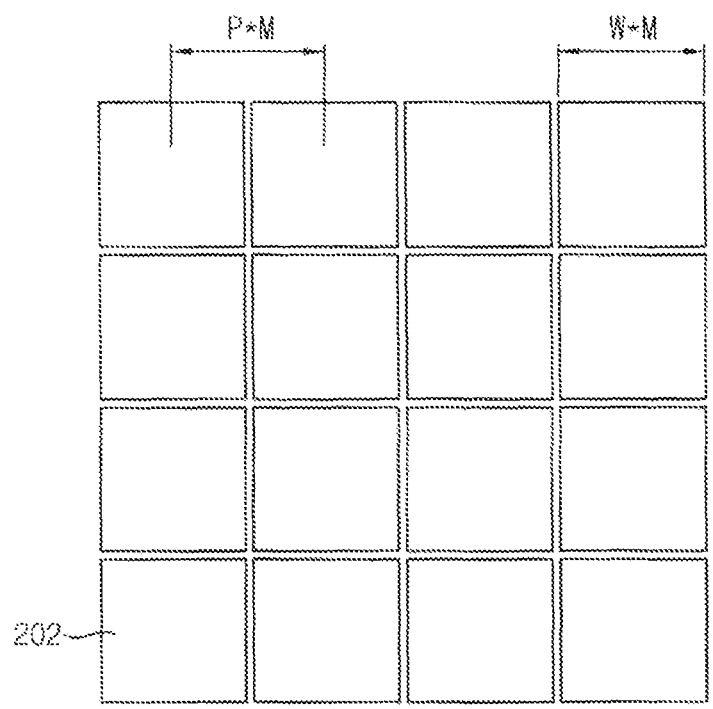
FIG. 5B is a view illustrating a micro mirror array magnified by a first projection lens of the optical system in FIG. 4 according to exemplary embodiments of the present invention.
Figure 5C:
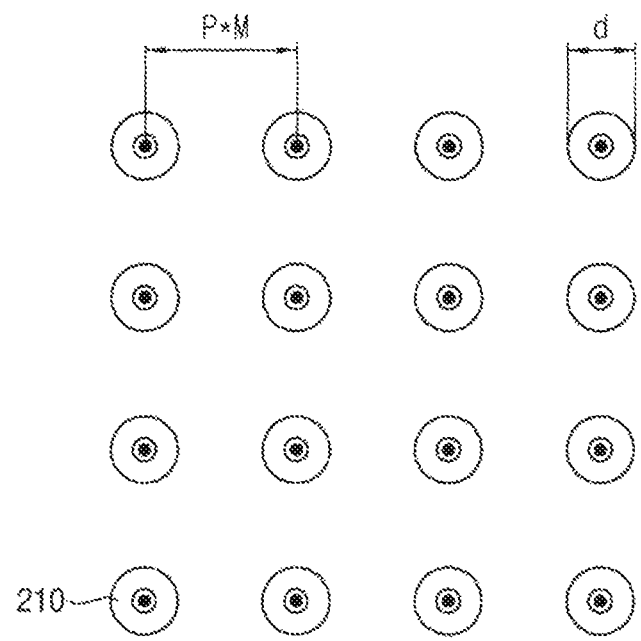
FIG. 5C is a view illustrating a beam array formed by a multi-lens array of the optical system in FIG. 4 according to exemplary embodiments of the present invention.
Figure 6:
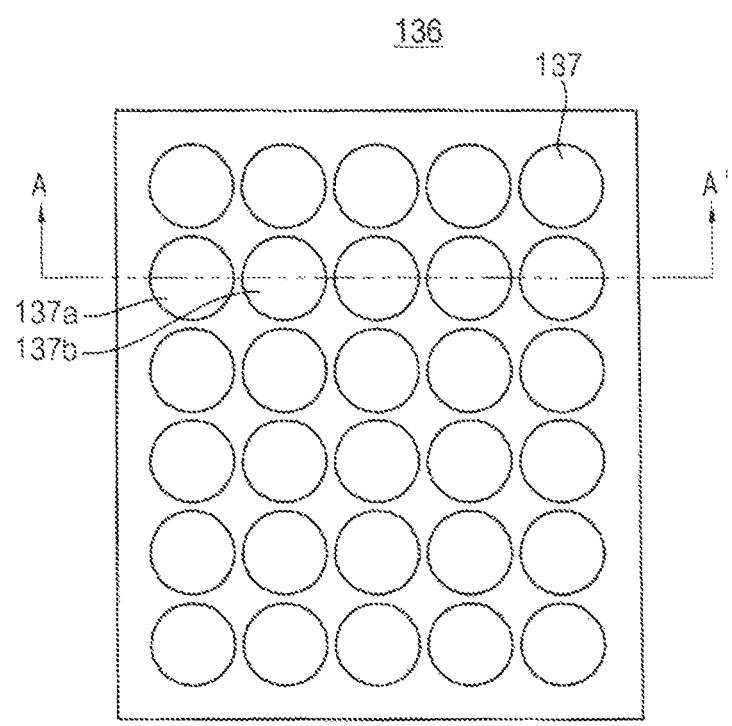
FIG. 6 is a plan view illustrating the multi-lens array of the optical system in FIG. 4 according to exemplary embodiments of the present invention.
Figure 7:
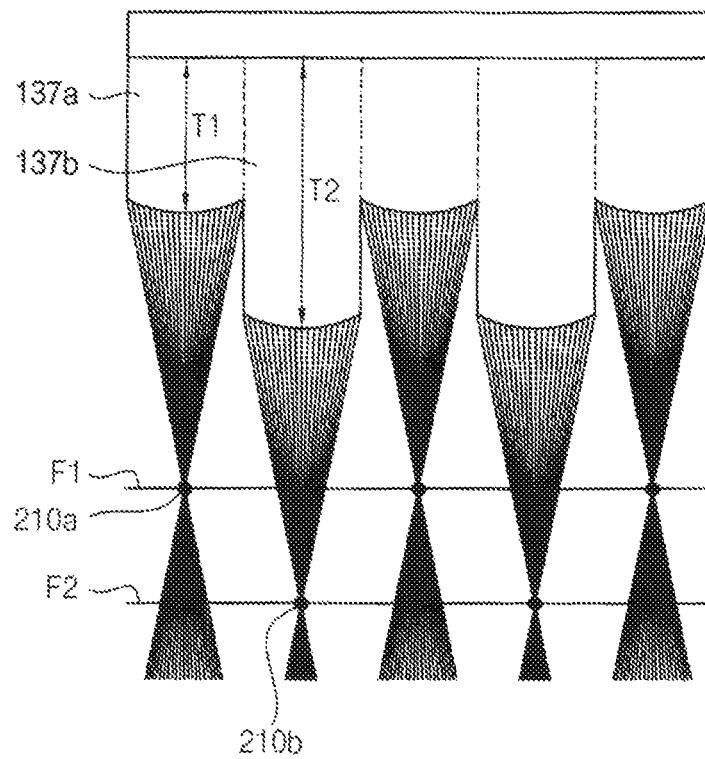
FIG. 7 is a cross-sectional view taken along line A-A' in FIG. 6 according to exemplary embodiments of the present invention.
Figure 8:
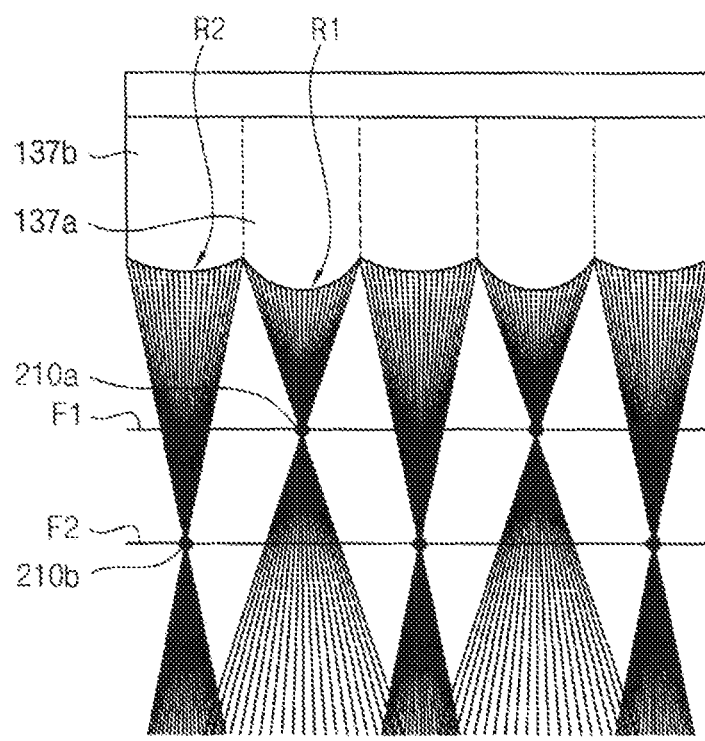
FIGS. 8 and 9 are cross-sectional views illustrating a multi-lens array according to exemplary embodiments of the present invention.
Figure 9:
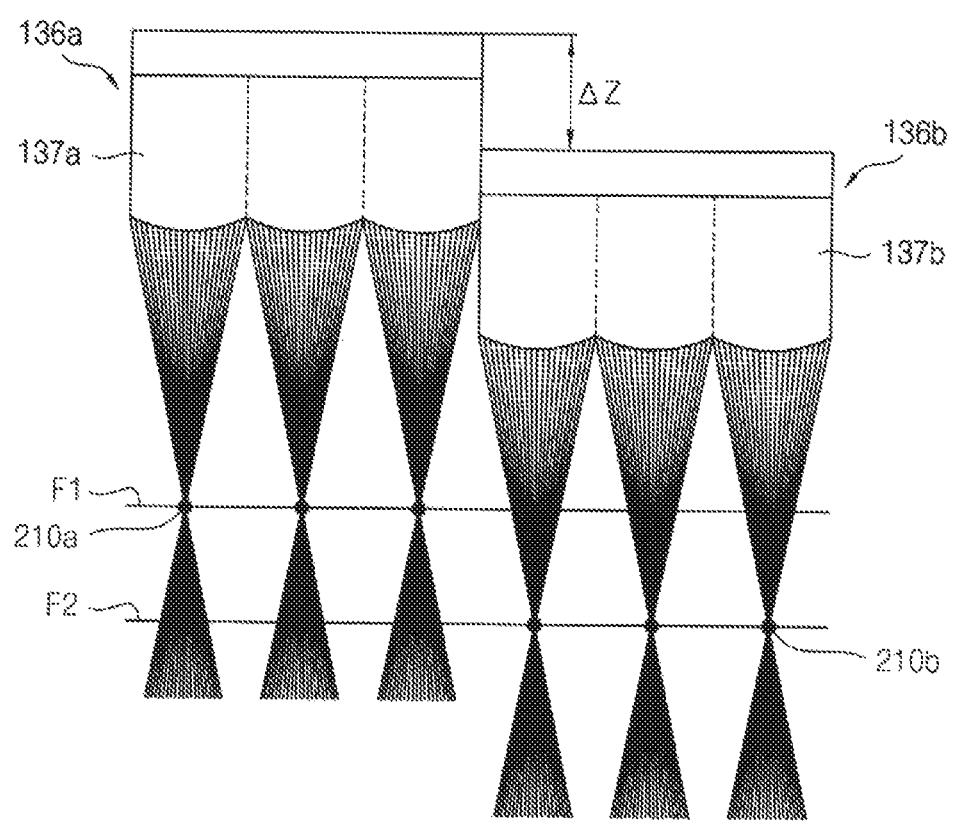
Figure 10:
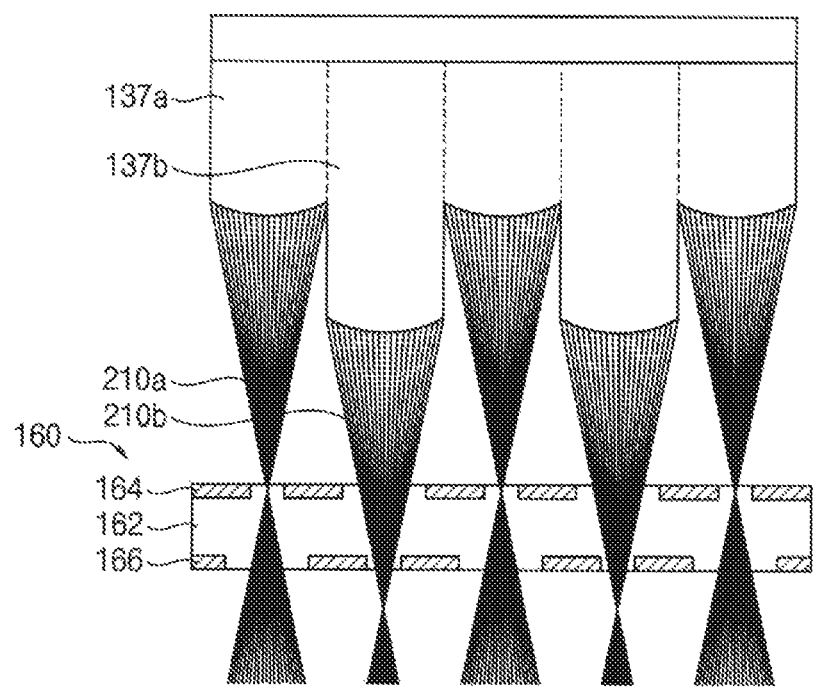
FIG. 10 is a view illustrating a spatial filter array arranged adjacent to the multi-lens array in FIG. 7 according to exemplary embodiments of the present invention.
Figure 11:
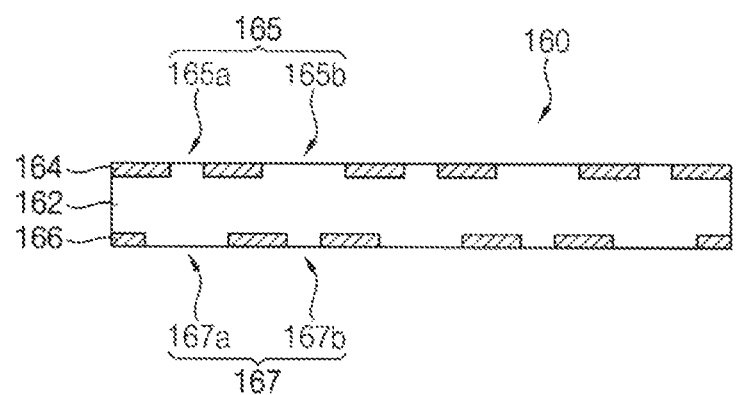
FIG. 11 is a cross-sectional view illustrating the spatial filter array in FIG. 10 according to exemplary embodiments of the present invention.
Figure 12:
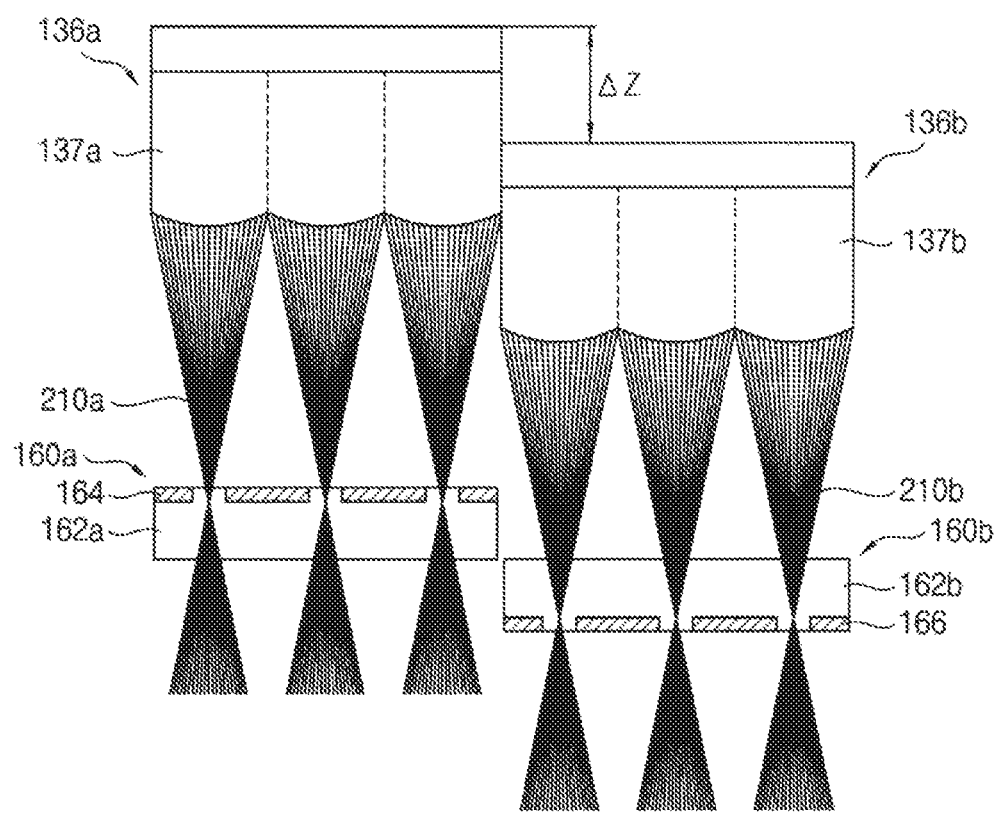
FIG. 12 is a view illustrating a spatial filter array arranged adjacent to the multi-lens array in FIG. 9 according to exemplary embodiments of the present invention.
Figure 13:
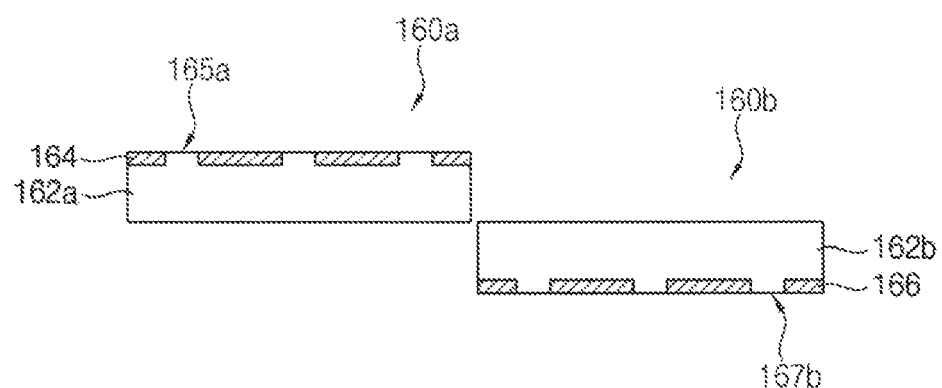
FIG. 13 is a cross-sectional view illustrating the spatial filter array in FIG. 12 according to exemplary embodiments of the present invention.
Figure 14A:
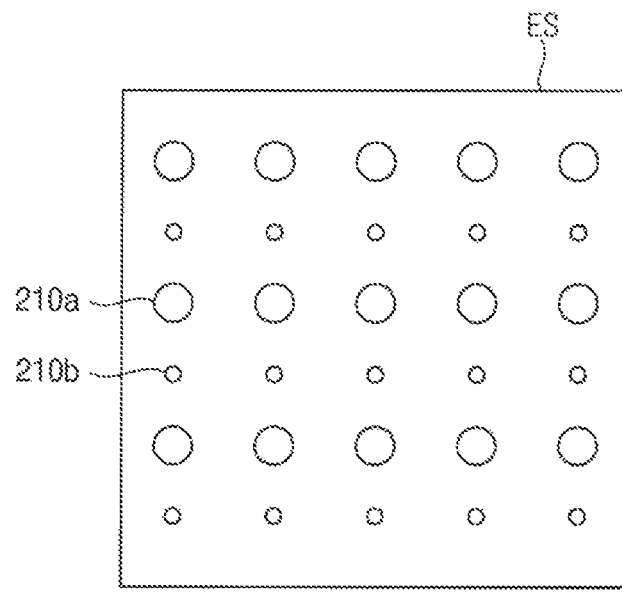
FIGS. 14A to 14D are views illustrating spot beams condensed on an exposure surface of a predetermined height, which are directed onto the exposure surface by an optical system of a maskless exposure apparatus according to exemplary embodiments of the present invention.
Figure 14B:
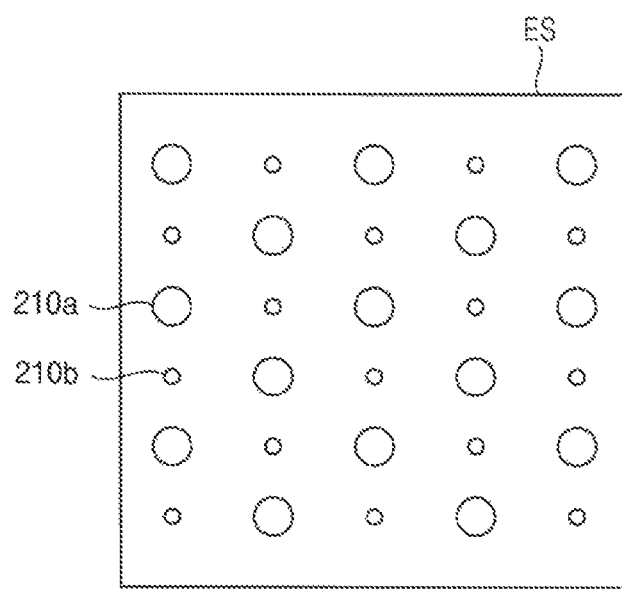
Figure 14C:
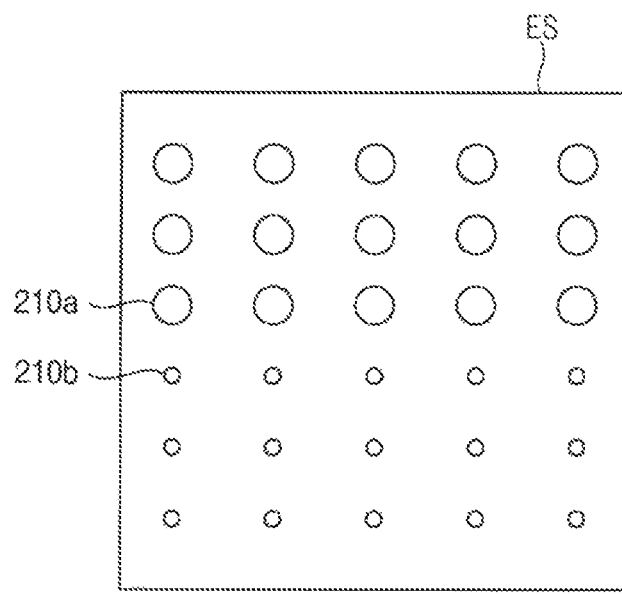
Figure 14D:
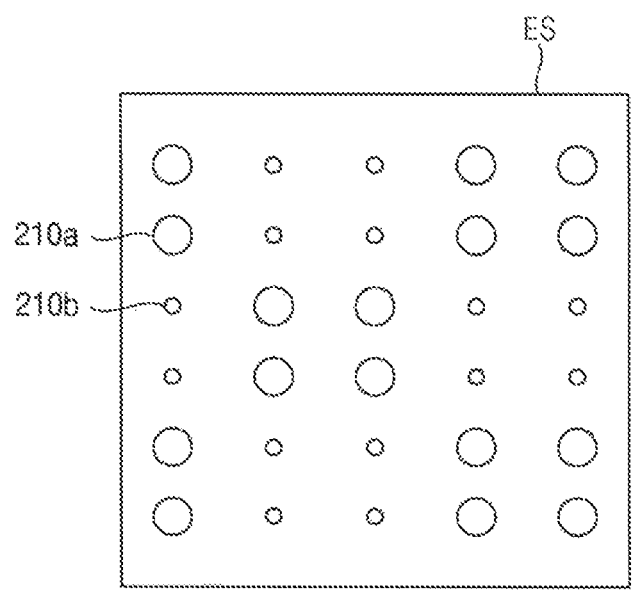
Figure 15:
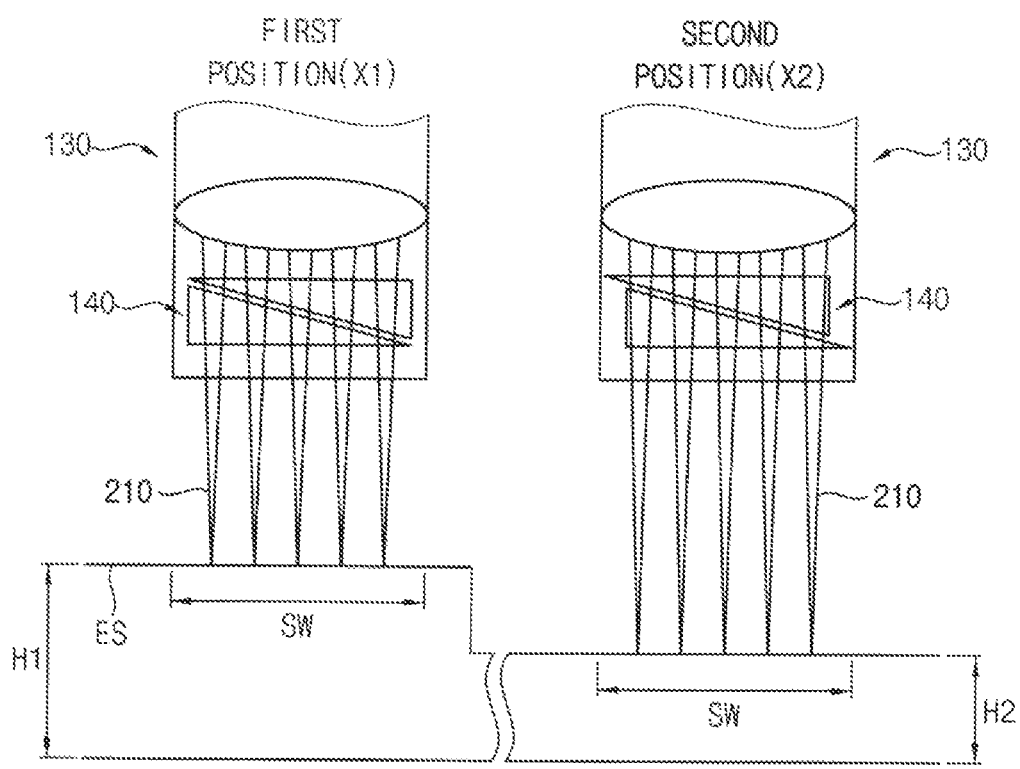
FIG. 15 is a cross-sectional view illustrating an autofocus device of the optical system in FIG. 1 according to exemplary embodiments of the present invention.
Figure 16:
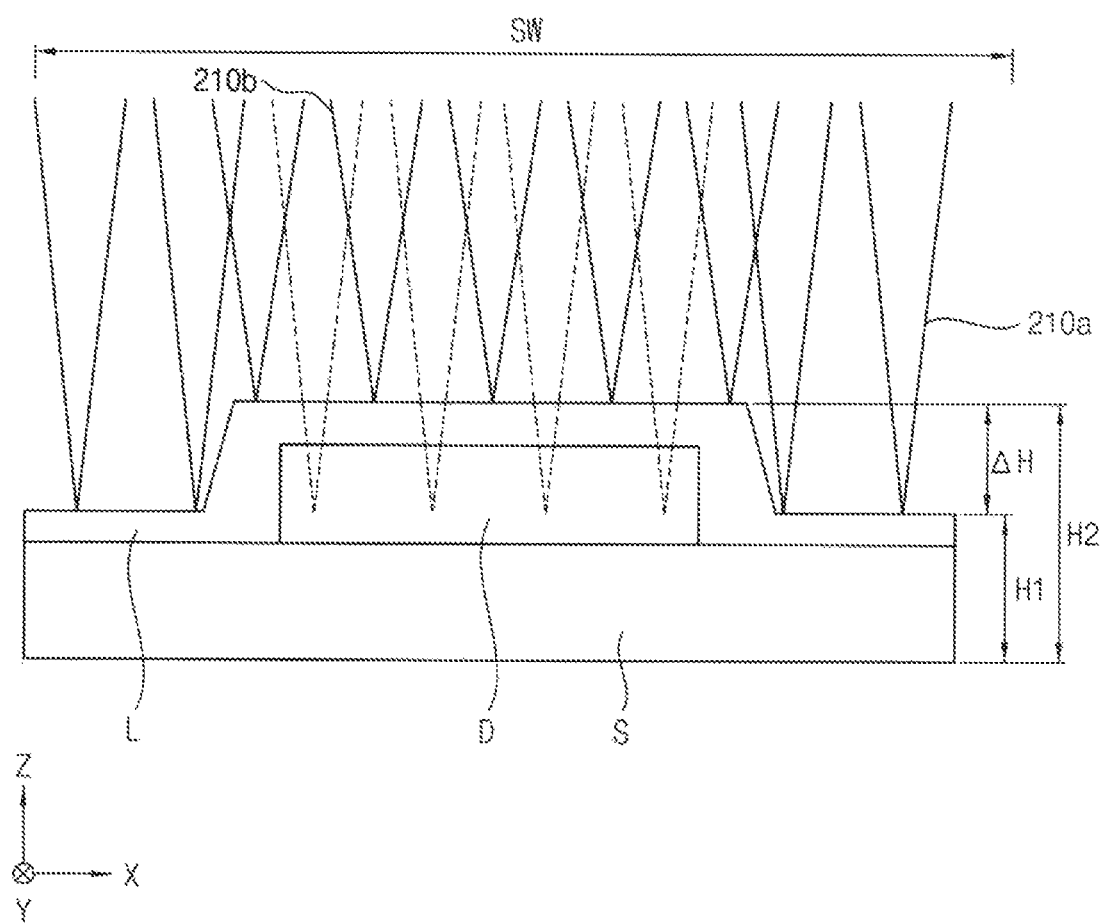
FIG. 16 is a cross-sectional view illustrating an object layer to be exposed by spot beams directed thereon by the optical system in FIG. 1 according to exemplary embodiments of the present invention.

FIG. 1 is a perspective view illustrating a maskless exposure apparatus according to exemplary embodiments of the present invention. FIG. 2 is a block diagram illustrating the maskless exposure apparatus in FIG. 1 according to exemplary embodiments of the present invention. FIG. 3 is a perspective view illustrating a bundle of spot beams directed onto an exposure surface by an optical head of the maskless exposure apparatus in FIG. 1 according to exemplary embodiments of the present invention. FIG. 4 is a cross-sectional view illustrating an optical system of the maskless exposure apparatus in FIG. 1 according to exemplary embodiments of the present invention. FIG. 5A is a view illustrating a micro mirror array of a light modulation element of the optical system in FIG. 4 according to exemplary embodiments of the present invention. FIG. 5B is a view illustrating a micro mirror array magnified by a first projection lens of the optical system in FIG. 4 according to exemplary embodiments of the present invention. FIG. 5C is a view illustrating a beam array formed by a multi-lens array of the optical system in FIG. 4 according to exemplary embodiments of the present invention. FIG. 6 is a plan view illustrating the multi-lens array of the optical system in FIG. 4 according to exemplary embodiments of the present invention. FIG. 7 is a cross-sectional view taken along line A-A' in FIG. 6 according to exemplary embodiments of the present invention. FIGS. 8 and 9 are cross-sectional views illustrating a multi-lens array according to exemplary embodiments of the present invention. FIG. 10 is a view illustrating a spatial filter array arranged adjacent to the multi-lens array in FIG. 7 according to exemplary embodiments of the present invention. FIG. 11 is a cross-sectional view illustrating the spatial filter array in FIG. 10 according to exemplary embodiments of the present invention. FIG. 12 is a view illustrating a spatial filter array arranged adjacent to the multi-lens array in FIG. 9 according to exemplary embodiments of the present invention. FIG. 13 is a cross-sectional view illustrating the spatial filter array in FIG. 12 according to exemplary embodiments of the present invention. FIGS. 14A to 14D are views illustrating spot beams condensed on an exposure surface of a predetermined height, which are directed onto the exposure surface by an optical system of a maskless exposure apparatus according to exemplary embodiments of the present invention. FIG. 15 is a cross-sectional view illustrating an autofocus device of the optical system in FIG. 1 according to exemplary embodiments of the present invention. FIG. 16 is a cross-sectional view illustrating an object layer to be exposed by spot beams directed thereon by the optical system in FIG. 1 according to exemplary embodiments of the present invention.

Referring to FIGS. 1 to 16, in exemplary embodiments, a maskless exposure apparatus 100 includes a stage 110 that supports a substrate S having an object layer L to be exposed, a light source 120 that outputs light, an optical system 130 that modulates the outputted light into a pattern beam and that condenses the pattern beam into a plurality of spot beams 210, and a controller 150 that controls the stage 110 and the optical system 130.

In exemplary embodiments, the maskless exposure apparatus 100 is a pattern generator that writes a pattern on the substrate S having a photosensitive layer as the object layer L deposited thereon. Thus, the object layer L may also be referred to herein as a photosensitive layer L. The maskless exposure apparatus 100 may be used, for example, for a photolithography process performed on a flat panel display (FPD) or a semiconductor wafer. The object layer L includes an exposure surface ES onto which the spot beams 210 are directed onto by the optical system 130, as described in further detail below.

As illustrated in FIGS. 1 and 2, the stage 110 may be a movable table which is movable in at least one direction. In exemplary embodiments, the stage 110 is disposed on a stage driving portion 112, and the stage 110 is movable in a first direction (e.g., an X direction) and a second direction (e.g., a Y direction) on the stage driving portion 112. The stage driving portion 112 may include, for example, a stage driving mechanism that moves the stage 110. The controller 150 may control the stage driving mechanism to move the stage 110.

As illustrated in FIG. 3, in exemplary embodiments, an optical system (e.g., an optical head) 130 generates a plurality of the spot beams 210, and directs the plurality of the spot beams 210 onto the photosensitive layer L while moving the stage 110 relative to the optical system 130. The optical system scans the photosensitive layer L with the spot beams 210. A width to be scanned one time using the spot beams 210 directed to the photosensitive layer L by the optical head 130 is referred to herein as a scan exposure width.

In exemplary embodiments, a plurality of the optical systems 130 may be installed over the stage 110. For example, a plurality of the optical systems 130 may be installed fixedly by a stage gantry to be spaced apart from one another. A multi-exposure head including a plurality of the optical systems 130 may direct a spatially modulated beam from a light outputted from the light source 120 onto the substrate S.

In exemplary embodiments, the optical system 130 modulates the outputted light into a pattern-forming light. The pattern-forming light is used to form a pattern of a virtual mask (VM). The optical system 130 may condense the pattern-forming light, and direct a plurality of the spot beams 210 onto the substrate S. For example, in exemplary embodiments, the optical system 130 includes a light modulation element 132 that spatially modulates the light emitted from the light source 120 into the pattern beam having the mask pattern (VM), and a projection optical system that projects the modulated pattern beam into a plurality of the spot beams, which are directed onto a surface of the substrate S.

As illustrated in FIGS. 2 and 4, in exemplary embodiments, the projection optical system includes a first projection lens 134 that magnifies the modulated light, a multi-lens array (MLA) 136 having a plurality of micro lenses 137 that separates the magnified pattern beam into a plurality of the spot beams and that collimates the spot beams, and a second projection lens 138 that adjusts the resolution of the spot beams and that transmits the adjusted spot beams. Thus, the first projection lens 134, the multi-lens array 136, and the second projection lens 138 may herein be collectively referred to as the projection optical system. In exemplary embodiments, the micro lenses 137 include first micro lenses 137a and second micro lenses 137b (see FIG. 6).

The light modulation element 132 may include, for example, a spatial light modulator (SLM). The light modulation element 132 may include, for example, a microelectromechanical system (MEMS) type digital micro-mirror device (DMD). A DMD includes a memory cell and a plurality of micro mirrors arranged in a matrix, and the controller 150 may output an exposure control signal for controlling ON/OFF of each micro mirror. When the light modulation element 132 includes M×N (for example, 1920× 400) micro mirrors, the multi-lens array 136 may correspondingly include M×N (for example, 1920×400) micro lenses 137. The light modulation element 132 may also be referred to herein as a light modulator 132.

As illustrated in FIG. 5A, the micro mirrors of the DMD may constitute a micro mirror array having predetermined pitch (P) and width (W). The micro mirrors may spatially modulate the light from the light source 120 into the pattern beam having a plurality of beams 200 according to the exposure control signal of the controller 150.

As illustrated in FIG. 5B, a plurality of the beams 200 may be magnified a predetermined magnification amount (M) by the first projection lens 134. For example, the pitch (P) and the width (W) of a plurality of the beams 200 may be magnified by the predetermined magnification amount (M) by the first projection lens 134. Accordingly, a plurality of magnified beams 202 resulting from the first projection lens 134 may have a pitch P*M and a width W*M.

As illustrated in FIG. 5C, a plurality of the magnified beams 202 may be condensed into a plurality of the spot beams 210 by the micro lenses 137 of the multi-lens array 136. In exemplary embodiments, the pitch (P*M) of a plurality of the beams 200 is not changed, and the width of a plurality of the beams 200 is reduced to d (in which d is less than W).

As a spot beam 210 moves away from a focal surface of the spot beams 210, a diameter of the spot beam 210 may get wider, while when the exposure surface ES is positioned in the focal surface, the diameter of the spot beam 210 may be at its minimum, thereby providing maximum resolution.

In exemplary embodiments, the multi-lens array 136 includes at least two groups of micro lens arrays. For example, in exemplary embodiments, the multi-lens array 136 includes a first micro lens array group 136a and a second micro lens array group 136b (see FIG. 9). The first micro lens array group 136a includes first micro lenses 137a that condense the modulated pattern beam into a first group of spot beams (e.g., first spot beams) 210a having a first focal position on a Z-axis substantially perpendicular to the exposure surface ES. The second micro lens array group 136b includes second micro lenses 137b that condense the modulated pattern beam into a second group of spot beams (e.g., second spot beams) 210b having a second focal position different from the first focal position. In exemplary embodiments, the first micro lenses 137a have a first refractive index, and the second micro lenses 137b have a second refractive index different from the first refractive index.

As illustrated in FIG. 7, in exemplary embodiments, the first micro lenses 137a included in the first micro lens array group 136a have a first thickness T1, and the second micro lenses 137b included in the second micro lens array group 136b have a second thickness T2 different from the first thickness T1. In exemplary embodiments, the first and second micro lenses 137a and 137b have about the same radius of curvature.

According to exemplary embodiments, first beams of a plurality of the beams 200 of the pattern beam are condensed into the first group of spot beams 210a having the first focal position by the first micro lens array group 136a, and second beams of a plurality of the beams 200 of the pattern beam are condensed into the second group of spot beams 210b having the second focal position by the second micro lens array group 136b.

The first group of spot beams 210a passing through the first micro lens array group 136a have a focal surface F1 of a first height, and the second group of spot beams 210b passing through the second micro lens array group 136b have a focal surface F2 of a second height different from the first height.

As illustrated in FIG. 8, in exemplary embodiments, the first micro lens array group 136a includes first micro lenses 137a having a first radius of curvature R1, and the second micro lens array group 136b includes second micro lenses 137b having a second radius of curvature R2 different from the first radius of curvature R1.

According to exemplary embodiments, first beams of a plurality of the beams 200 of the pattern beam are condensed into the first group of spot beams 210a having a first focal position by the first micro lens array group 136a, and second beams of a plurality of the beams 200 of the pattern beam are condensed into the second group of spot beams 210b having a second focal position by the second micro lens array group 136b.

According to exemplary embodiments, the first group of spot beams 210a passing through the first micro lens array group 136a have a focal surface F1 of a first height, and the second group of spot beams 210b passing through the second micro lens array group 136b have a focal surface F2 of a second height different from the first height.

As illustrated in FIG. 9, in exemplary embodiments, the first micro lens array group 136a includes first micro lenses 137a having a first position on the Z-axis, and the second micro lens array group 136b includes second micro lenses 137b having a second position on the Z-axis different from the first position.

According to exemplary embodiments, first beams of a plurality of the beams 200 of the pattern beam are condensed into the first group of spot beams 210a having a first focal position by the first micro lens array group 136a, and second beams of a plurality of the beams 200 of the pattern beam are condensed into the second group of spot beams 210b having a second focal position by the second micro lens array group 136b.

According to exemplary embodiments, the first group of spot beams 210a passing through the first micro lens array group 136a have a focal surface F1 of a first height, and the second group of spot beams 210b passing through the second micro lens array group 136b have a focal surface F2 of a second height different from the first height.

In exemplary embodiments, the first and second micro lens array groups 136a and 136b are configured such that the first focal positions of the first micro lens array group 136a and the second focal positions of the second micro lens array group 136b vary according to a height difference of the object layer L, respectively.

For example, in exemplary embodiments, positions of the first and second micro lenses 137a and 137b are adjustable on the Z-axis. In exemplary embodiments, the first and second micro lenses 137a and 137b are movable relative to each other on the Z-axis. A height difference ($\Delta Z$) between the first and second micro lenses 137a and 137b may be determined according to the height difference of the object layer L.

In exemplary embodiments, the controller 150 receives information relating to the height difference of the object layer L (e.g., information indicating the height difference of the object layer L). Based on this information, exposure data is generated. For example, the exposure data is generated based on the detected height difference of the object layer L. The exposure data is used to assign the first spot beams 210a to a first portion of the object layer L having a first height and the second spot beams 210b to a second portion of the object layer L having a second height. The first and second beams of a plurality of beams 200 of the pattern beam correspond to the first and second micro lens array groups 136a and 136b, respectively, according to the exposure data. The first spot beams 210a are directed onto the first portion of the object layer L having the first height, and the second spot beams 210b are directed onto the second portion of the object layer L having the second height.

In exemplary embodiments, the maskless exposure apparatus 100 further includes a spatial filter array 160 that filters the spot beams condensed by the multi-lens array 136.

As illustrated in FIGS. 10 and 11, in exemplary embodiments, the spatial filter array 160 includes filtering holes 165 and 167 that filter the spot beams. In exemplary embodiments, the spatial filter array 160 includes first filtering holes 165a and 167a that filter the first group of spot beams 210a, and second filtering holes 165b and 167b that filter the second group of spot beams 210b.

In exemplary embodiments, the spatial filter array 160 includes a transparent member 162 and a blocking pattern formed on a surface of the transparent member 162 that define the filtering holes 165 and 167. The transparent member may include, for example, fused silica glass. The blocking pattern may include a metal capable of blocking light such as, for example, chromium.

In exemplary embodiments, the blocking pattern includes a first blocking pattern 164 formed on a first surface of the transparent member 162, and a second blocking pattern 166 formed on a second surface of the transparent member 162 opposite to the first surface. The first blocking pattern 164 defines first upper filtering holes 165a that filter the first group of spot beams 210a, and second upper filtering holes 165b that filter the second group of spot beams 210b. The second blocking pattern 166 defines first lower filtering holes 167a that filter the first group of spot beams 210a, and second lower filtering holes 167b that filter the second group of spot beams 210b.

Accordingly, in exemplary embodiments, the first group of spot beams 210a condensed by the first micro lenses 137a penetrate through the first upper and lower filtering holes 165a and 167a, which have a predetermined size. As a result, noise may be removed. In addition, the second group of spot beams 210b condensed by the second micro lenses 137b penetrate through the second upper and lower filtering holes 165b and 167b, which have a predetermined size. As a result, noise may be removed.

As illustrated in FIGS. 12 and 13, in exemplary embodiments, the spatial filter array 160 includes a first filter array 160a that filters the first group of spot beams 210a, and a second filter array 160b that filters the second group of spot beams 210b.

In exemplary embodiments, when the first micro lens array group 136a has a first position on the Z-axis, and the second micro lens array group 136b has a second position on the Z-axis different from the first position, the first filter array 160a is arranged to have a third position on the Z-axis corresponding to the first micro lens array group 136a, and the second filter array 160b is arranged to have a fourth position on the Z-axis different from the third position corresponding to the second micro lens array group 136b.

In exemplary embodiments, the first filter array 160a includes a first transparent member 162a and a first blocking pattern 164 formed on a first surface of the first transparent member 162a that define first filtering holes 165a. The second filter array 160b includes a second transparent member 162b and a second blocking pattern 166 formed on a second surface of the second transparent member 162b that define second filtering holes 167b.

Accordingly, in exemplary embodiments, the first group of spot beams 210a condensed by the first micro lenses 137a penetrates through the first filtering holes 165a, which have a predetermined size. As a result, noise may be removed. Further, the second group of spot beams 210b condensed by the second micro lenses 137b penetrate through the second filtering holes 167b, which have a predetermined size. As a result, noise may be removed.

As illustrated in FIGS. 14A to 14D, in exemplary embodiments, the first and second micro lens array groups 136a and 136b have different arrangements. For example, the first and second spot beams 210a and 210b may be arranged according to the arrangements of the first and second micro lenses 137a and 137b. The diameter of the first spot beam 210a in the exposure surface ES at a specific height may be different from the diameter of the second spot beam 210b in the exposure surface ES.

As illustrated in FIG. 15, in exemplary embodiments, the optical system 130 further includes an autofocus device 140. The autofocus device 140 may adjust foci of the spot beams 210. For example, the foci of all of the spot beams 210 within the scan width SW may be adjusted together along the Z-axis by the autofocus device 140.

When the optical head 130 scans the exposure surface ES of a first height H1 within the exposure scan width SW along the Y axis at a first position (X1), the foci of all of the spot beams 210 directed by the optical head 130 onto the exposure surface ES may be adjusted by the autofocus device 140. Similarly, when the optical head 130 scans the exposure surface ES of a second height H2 within the exposure scan width SW along the Y axis at a second position (X2), the foci of all of the spot beams 210 directed by the optical head 130 onto the exposure surface ES may be adjusted by the autofocus device 140.

As illustrated in FIG. 16, in exemplary embodiments, when the photosensitive layer L on a die D arranged on the substrate S has a height difference ΔH within the exposure scan width SW, a first portion of the photosensitive layer L having a first height H1 is exposed with the first spot beams 210a having the maximum resolution at the first height (e.g., having a focal surface of the first height H1), and a second portion of the photosensitive layer L having a second height H2 is exposed with the second spot beams 210b having the maximum resolution at the second height (e.g., having a focal surface of the second height H2).

Accordingly, when an object layer has a step difference in a region that is smaller than the exposure scan width SW, which may result in an autofocus function not properly functioning (e.g., because the same autofocus function is applied to all spot beams), exemplary embodiments of the present invention expose the object layer with spot beams having different focal surfaces of different heights. As a result, resolution degradation due to defocus may be prevented or reduced, and the resolution of the exposure apparatus may be improved.

Hereinafter, a method of exposing an object layer on a substrate using the above-described maskless exposure apparatus, and a method of manufacturing a semiconductor device using the same, will be described. The maskless exposure method may be used for manufacturing, for example, a panel level package. Hereinafter, an exemplary scenario will be described in which the semiconductor device being manufactured is a panel level package. However, it is to be understood that the semiconductor device manufactured according to the method of manufacturing a semiconductor device according to exemplary embodiments of the present invention is not limited to a panel level package.

Figure 17:
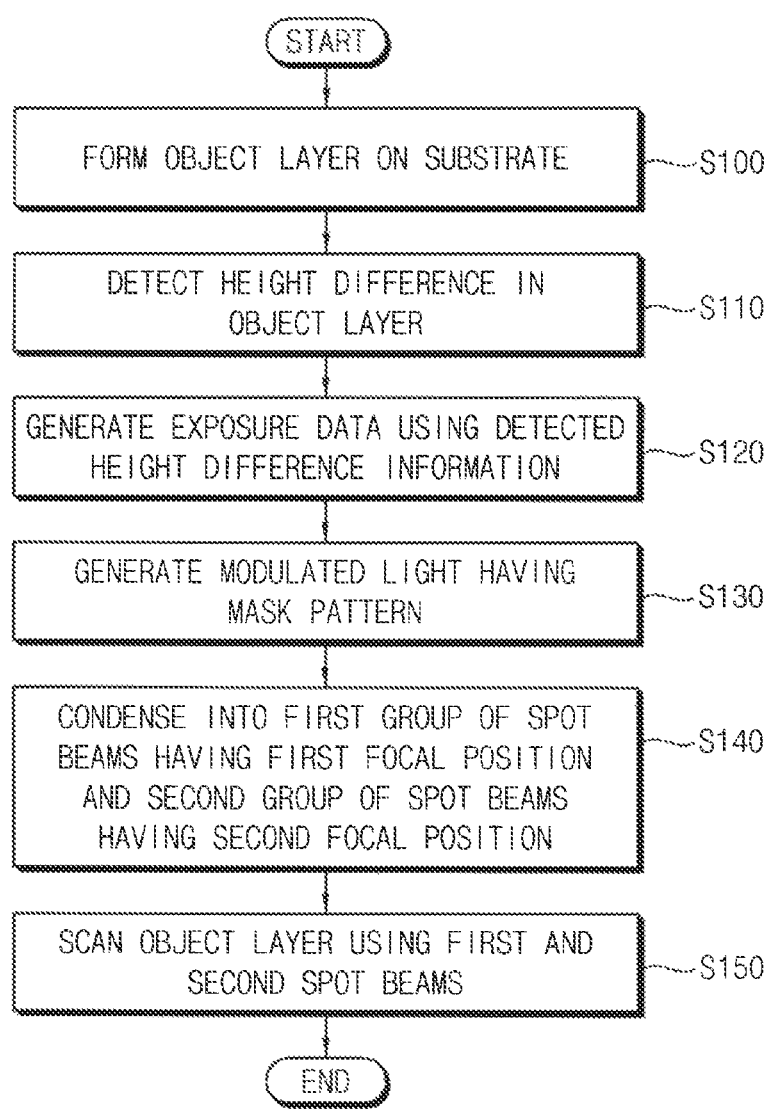
FIG. 17 is a flowchart illustrating a maskless exposure method according to exemplary embodiments of the present invention.
Figure 18:
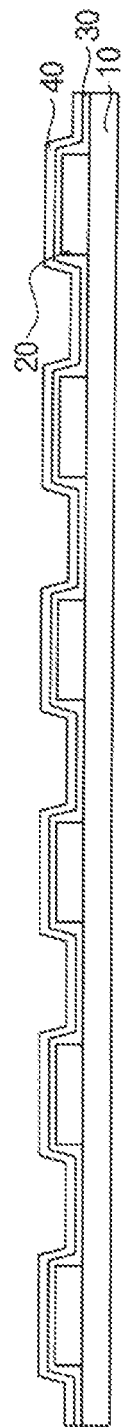
FIGS. 18 to 20 are views illustrating a method of manufacturing a semiconductor device according to exemplary embodiments of the present invention.
Figure 19:
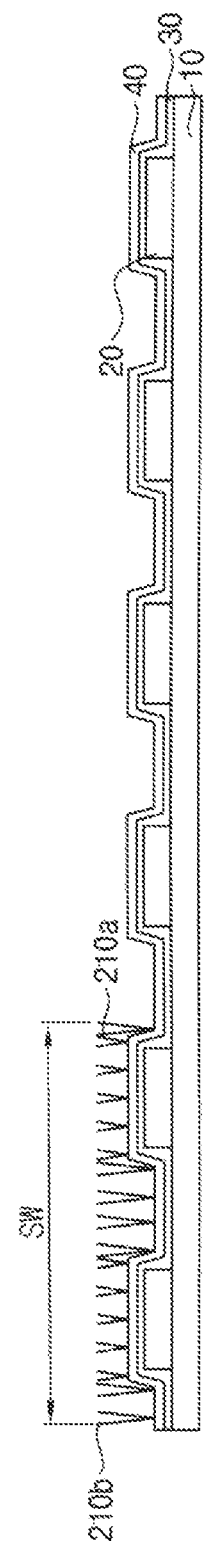
Figure 20:
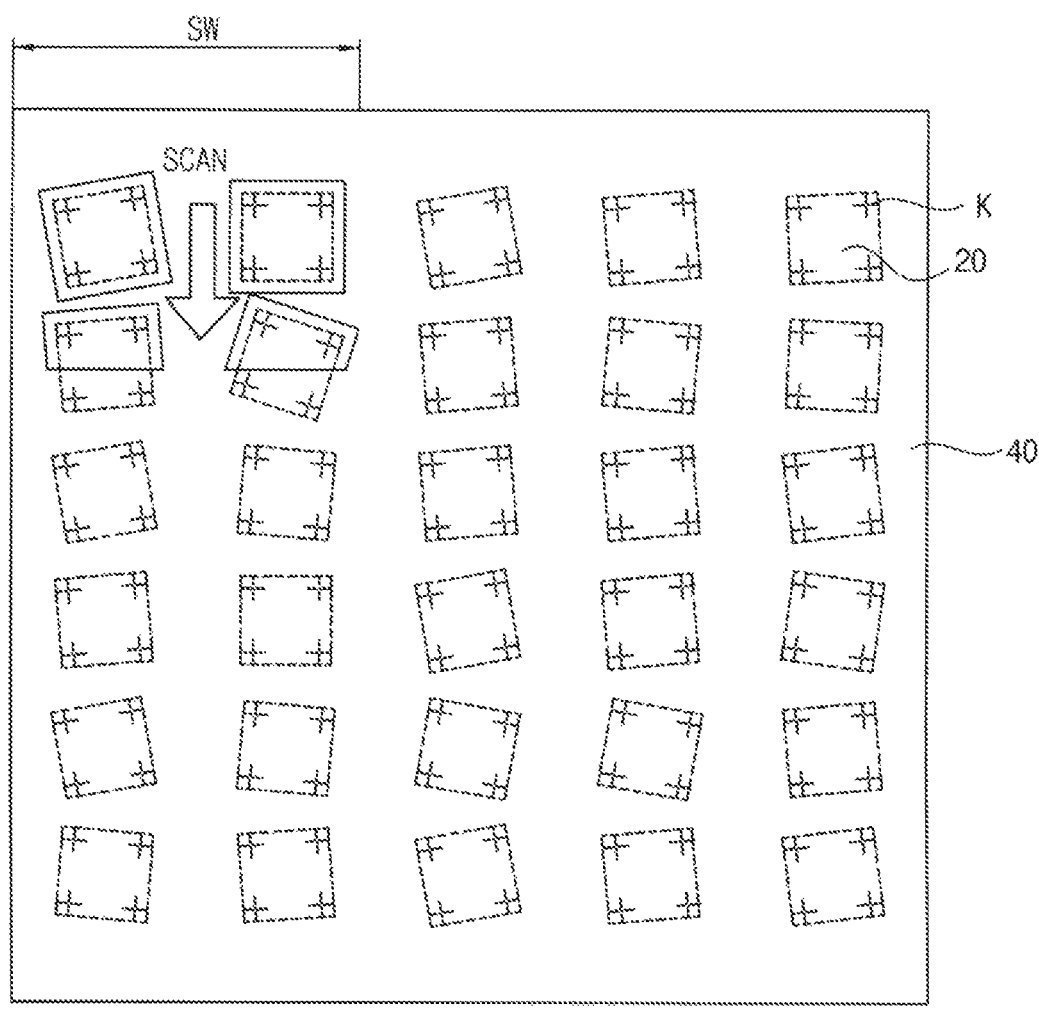

FIG. 17 is a flowchart illustrating a maskless exposure method according to exemplary embodiments of the present invention. FIGS. 18 to 20 are views illustrating a method of manufacturing a semiconductor device according to exemplary embodiments of the present invention.

Referring to FIGS. 17 to 20, in exemplary embodiments, an object layer 40 is formed on a substrate (S100), a height difference of the object layer 40 is detected (S110), and exposure data is generated using the detected height difference information (S120).

As illustrated in FIG. 18, in exemplary embodiments, a wafer is diced into a plurality of dies 20, and the dies 20 are arranged on a substrate 10. A conductive layer 30 that covers the dies 20 is then formed on the substrate 10, and a photoresist layer 40 (e.g., the object layer 40) is then formed on the conductive layer 30.

Position coordinates (e.g., X, Y coordinate values) of each die 20 and the photoresist layer 40 on the die 20 may be obtained using align keys K on a surface of the die 20. Information relating to the height difference (e.g., information indicating the height difference) of the photoresist layer 40 on each coordinate may then be obtained.

Exposure data which assign a first portion of the photoresist layer 40 having a first height to be exposed with first spot beams 210a, and a second portion of the photoresist layer 40 having a second height different from the first height to be exposed with second spot beams 210b, is generated using the information indicating the height difference.

A modulated light having a mask pattern is then generated (S130). A plurality of beams of the modulated light is then condensed into a first group of spot beams having a first focal position and a second group of spot beams having a second focal position (S140). Then, the object layer 40 is scanned with the first and second groups of the spot beams (S150).

As illustrated in FIGS. 19 and 20, in exemplary embodiments, a plurality of the beams of the modulated beam corresponds to the first and second micro lens array groups 136a and 136b, respectively, according to the exposure data. Then, a first portion of the photoresist layer 40 having a first height is exposed with the first spot beams 210a, and a second portion of the photoresist layer 40 having a second height is exposed with the second spot beams 210b. The substrate 10 may then be diced into respective chips to manufacture a semiconductor package.

Accordingly, in exemplary embodiments of the present invention, when an object layer has a height difference in a region that is smaller than an exposure scan width SW (e.g., when, within one exposure scan width SW, an object layer has a height difference), the object layer is exposed with spot beams having different focal surfaces of different heights. As a result, resolution of the exposure apparatus may be improved.

A virtual mask pattern may be transferred to a substrate such as a glass substrate and a semiconductor wafer using a maskless exposure apparatus according to exemplary embodiments of the present invention. For example, to form a circuit layer on the wafer, a photoresist layer may be deposited on the wafer, and a mask pattern may be transferred to the photoresist layer using the maskless exposure apparatus. Then, a developing process may be performed on the photoresist layer to form a photoresist pattern, and an etch process may be performed using the photoresist pattern to form a desired circuit pattern on the wafer.

A display device, a semiconductor device, etc. may be manufactured by the exposure apparatus. The display device may include, for example, an Organic Light Emitting Display (OLED) device. The semiconductor device may include, for example, a Fin Field Effect Transistor (finFET) device, a Dynamic Random Access Memory (DRAM) device, a Vertical NAND (VNAND) memory device, etc. The devices may be used to implement, for example, a desktop computer, a portable computer, a laptop computer, a personal portable terminal, a tablet computer, a cell phone, a digital music player, etc.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A maskless exposure method, comprising:
    generating exposure data based on a detected height difference between a first height and a second height in an object layer;
    spatially modulating a light output from a light source into a pattern beam having a mask pattern;
    condensing the modulated pattern beam into a first group of spot beams having a first focal position on a Z-axis substantially perpendicular to an exposure surface of the object layer, and a second group of spot beams having a second focal position different from the first focal position; and
    scanning a first portion of the object layer having the first height with the first group of spot beams according to the exposure data, and a second portion of the object layer having the second height, which is different from the first height, with the second group of spot beams according to the exposure data.

2. The method of claim 1, wherein condensing the modulated pattern beam into the first and second groups of spot beams comprises:
    forming the first group of spot beams by passing the modulated pattern beam through a first micro lens array group; and
    forming the second group of spot beams by passing the modulated pattern beam through a second micro lens array group.

3. The method of claim 2, wherein the first micro lens array group comprises a plurality of first micro lenses having a first thickness, and the second micro lens array group comprises a plurality of second micro lenses having a second thickness different from the first thickness.

4. The method of claim 2, wherein the first micro lens array group comprises a plurality of first micro lenses having a first radius of curvature, and the second micro lens array group comprises a plurality of second micro lenses having a second radius of curvature different from the first radius of curvature.

5. The method of claim 2, wherein the first micro lens array group comprises a plurality of first micro lenses disposed at a first position on the Z-axis, and the second micro lens array group comprises a plurality of second micro lenses disposed at a second position on the Z-axis different from the first position.

6. The method of claim 5, further comprising:
    adjusting the first position of the first micro lenses on the Z-axis; and
    adjusting the second position of the second micro lenses on the Z-axis.

7. The method of claim 1, wherein the height difference is within a scan exposure width of the first and second spot beams.

8. The method of claim 1, further comprising:
    adjusting the first focal position of the first group of spot beams and the second focal position of the second group of spot beams according to the height difference between the first height and the second height in the object layer.

9. The method of claim 1, further comprising:
    filtering the first and second groups of spot beams, wherein the first and second groups of spot beams are condensed by a multi-lens array.

10. The method of claim 1, wherein the first portion of the object layer is scanned with the first group of spot beams and the second portion of the object layer is scanned with the second group of spot beams within a scan exposure width.

11. A method of manufacturing a semiconductor device, comprising:
    forming an object layer on a substrate, wherein the object layer has a first height and a second height different from the first height;
    detecting a height difference between the first height and the second height;
    generating exposure data based on the detected height difference;
    spatially modulating a light output from a light source into a pattern beam having a mask pattern;
    condensing the modulated pattern beam into a first group of spot beams having a first focal position on a Z-axis substantially perpendicular to an exposure surface of the object layer, and a second group of spot beams having a second focal position different from the first focal position; and
    scanning a first portion of the object layer having the first height with the first group of spot beams according to the exposure data, and a second portion of the object layer having the second height with the second group of spot beams according to the exposure data.

12. The method of claim 11, wherein condensing the modulated pattern beam into the first and second groups of spot beams comprises:
    forming the first group of spot beams by passing the modulated pattern beam through a first micro lens array group; and
    forming the second group of spot beams by passing the modulated pattern beam through a second micro lens array group.

13. The method of claim 12, wherein the first micro lens array group comprises a plurality of first micro lenses having a first thickness, and the second micro lens array group comprises a plurality of second micro lenses having a second thickness different from the first thickness.

14. The method of claim 12, wherein the first micro lens array group comprises a plurality of first micro lenses having a first radius of curvature, and the second micro lens array group comprises a plurality of second micro lenses having a second radius of curvature different from the first radius of curvature.

15. The method of claim 12, wherein the first micro lens array group comprises a plurality of first micro lenses disposed at a first position on the Z-axis, and the second micro lens array group comprises a plurality of second micro lenses disposed at a second position on the Z-axis different from the first position.

16. The method of claim 15, further comprising:
adjusting the first position of the first micro lenses on the Z-axis; and
adjusting the second position of the second micro lenses on the Z-axis.

17. The method of claim 11, wherein the height difference is within a scan exposure width of the first and second spot beams.

18. The method of claim 11, wherein spatially modulating the light comprises forming a plurality of beams having the mask pattern using a digital micro-mirror device.

19. The method of claim 11, wherein forming the object layer on the substrate comprises:
disposing a plurality of dies on the substrate;
forming a conductive layer on the substrate, wherein the conductive layer covers the dies; and
forming a photoresist layer as the object layer on the conductive layer.

20. A method of manufacturing a semiconductor device, comprising:
forming an object layer on a substrate, wherein the object layer has a first height and a second height different from the first height;
detecting a height difference between the first height and the second height;
spatially modulating a light output from a light source into a pattern beam having a mask pattern;
condensing the modulated pattern beam into a first group of spot beams having a first focal position on a Z-axis substantially perpendicular to an exposure surface of the object layer, and a second group of spot beams having a second focal position different from the first focal position; and
scanning the exposure surface with the first group of spot beams and the second group of spot beams within a scan exposure width based on the detected height difference.

* * * * *